(12) United States Patent
Ogawa et al.

(10) Patent No.: US 6,280,650 B1
(45) Date of Patent: Aug. 28, 2001

(54) PIEZOELECTRIC CERAMIC COMPOSITION, BUZZER AND ACTUATOR USING THE SAME

(75) Inventors: Tomoyuki Ogawa; Katsuhiro Horikawa, both of Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/544,850

(22) Filed: Apr. 6, 2000

(30) Foreign Application Priority Data

Apr. 8, 1999 (JP) ................................. 11-100941

(51) Int. Cl.⁷ ..................... C04B 35/499; C04B 35/493; H01L 41/187; G10K 9/122
(52) U.S. Cl. ................... 252/62.9 PZ; 501/134; 310/328; 310/334; 340/384.6
(58) Field of Search .................... 310/328, 334; 340/384.6; 501/134; 252/62.9 PZ

(56) References Cited

U.S. PATENT DOCUMENTS 4,210,546 * 7/1980 Ouchi et al. .................. 252/62.9 PZ
4,255,272 * 3/1981 Ogawa ......................... 252/62.9 PZ

* cited by examiner

Primary Examiner—C. Melissa Koslow
(74) Attorney, Agent, or Firm—Ostrolenk, Faber, Gerb & Soffen, LLP

(57) ABSTRACT

A piezoelectric buzzer formed by using a piezoelectric ceramic having both a higher heat resistance and a higher piezoelectric characteristics than those of a conventional product. The piezoelectric buzzer 10 of the present invention has a metal plate 12. Formed on the metal plate 12 is a piezoelectric ceramic 14. Further, formed on the piezoelectric ceramic 14 is an electrode 16. The piezoelectric composition forming the piezoelectric ceramic is a piezoelectric ceramic composition characterized in that about 0.2 to 2 mol % of the Pb atoms of a lead zirconate titanate (PZT) represented by the composition formula $Pb_A[(Ti_xZr_{1-x})_a(Sn_yCr_{1-y})_bSb_c]O_3$ has been displaced by La, wherein $0.94 \leq A \leq 1.02, 0.46 \leq x \leq 0.51, 0.01 \leq y \leq 0.5, 0.01 \leq b \leq 0.03, 0.01 \leq c \leq 0.04, a+b+c=1$.

12 Claims, 2 Drawing Sheets

PIEZOELECTRIC CERAMIC COMPOSITION, BUZZER AND ACTUATOR USING THE SAME

BACKGROUND OF THE INVENTION

1. Field of the Invention

The present invention relates to a piezoelectric ceramic composition and a buzzer and a piezoelectric actuator using the piezoelectric ceramic composition.

2. Description of the Related Art

There have been known various different piezoelectric devices formed by using a piezoelectric ceramic composition. Several such known piezoelectric devices are, for example, a piezoelectric buzzer, a piezoelectric actuator, a piezoelectric sensor and a piezoelectric ceramic filter.

In a process for attaching a piezoelectric device to a circuit board, the piezoelectric ceramic forming the piezoelectric device will be exposed to a high temperature of 200° C. or higher in a reflow furnace. For this reason, it is required that the piezoelectric ceramic should have a sufficient heat resistance.

In order to increase heat resistance of a piezoelectric ceramic formed by using lead zirconate titanate (hereinafter referred to as PZT), it has been known that some effective treatments are to increase the Curie temperature of the piezoelectric ceramic and to reduce the electrical resistivity of the piezoelectric ceramic. The reason for reducing the electrical resistivity of a piezoelectric ceramic may be explained as follows. If the electrical resistivity of a piezoelectric ceramic is reduced, it may be made possible to inhibit generation of pyroelectric charges at a temperature which is lower than Curie temperature, the pyroelectric charges causing a field reversing phenomenon that will in turn cause a reversed polarization, hence resulting in a deterioration in its piezoelectric characteristics such as the piezoelectric d constant and electromechanical coupling coefficient.

Further, in order to reduce the electric resistivity without greatly reducing the Curie temperature of a PZT ceramic, there is known another method in which an extremely small amount of Cr, Mn or the like is added to the ceramic. However, if Cr, Mn or the like is added in the above ceramic, its piezoelectric characteristics will be deteriorated. In order to avoid such a deterioration, further added was Nb or Sb, or the Pb displaced with Ca, Sr, Ba, La or the like, thereby prohibiting the deterioration of the piezoelectric characteristics while at the same time keeping its electric resistivity at a relatively low value although its Curie temperature will become a little lower. As such a piezoelectric ceramic composition, there has been, for example, an improved material formed by the PZT containing La, Cr and Sb as disclosed in Japanese laid-open patent applications (Tokkai) No. 10-7460 and No. 10-95666.

However, it was found that the above discussed conventional piezoelectric ceramic composition suffers a considerable deterioration in its piezoelectric characteristics due to the presence of Cr or Mn, and it was also found that even if Nb or Sb was added or Pb was displaced by Ca, Sr, Ba, La or the like in order to inhibit deterioration in its piezoelectric characteristics, the piezoelectric characteristics were still very low, resulting in a problem that it was impossible to obtain high piezoelectric characteristics and high heat resistance, both of which are however required when forming a piezoelectric buzzer or a piezoelectric actuator.

In general, larger piezoelectric characteristics such as a piezoelectric d constant and electromechanical coupling coefficient will ensure a higher performance for a piezoelectric device such as a piezoelectric buzzer and a piezoelectric actuator. On the other hand, since the performance of a piezoelectric device is likely to be deteriorated during the attachment process carried out in a reflow furnace, and since it is very important to ensure a stable drive at a high temperature, it is required that a piezoelectric ceramic should have a high heat resistance.

SUMMARY OF THE INVENTION

It is one object of the present invention to provide a piezoelectric ceramic composition suitable for use in forming a piezoelectric ceramic having both a higher heat resistance and a higher piezoelectric characteristics than those of a conventional product.

Further, the present invention is to provide a piezoelectric buzzer formed by using a piezoelectric ceramic having both higher heat resistance and higher piezoelectric characteristics than those of a conventional product.

Moreover, the present invention is to provide a piezoelectric actuator formed by using a piezoelectric ceramic having both a higher heat resistance and a higher piezoelectric characteristics than those of a conventional product.

A piezoelectric ceramic composition of the present invention is characterized in that about 0.2 to 2 mol % of the Pb of the lead zirconate titanate (PZT) represented by a composition formula $Pb_A[(Ti_xZr_{1-x})_a(Sn_yCr_{1-y})_bSb_c]O_3$ has been displaced by La, wherein A, x, y, a, b, c in the above composition formula satisfy the following equations:

$$0.94 \leq A \leq 1.02,\ 0.46 \leq x \leq 0.51,\ 0.01 \leq y \leq 0.5,\ 0.01 \leq b \leq 0.03,$$
$$0.01 \leq c \leq 0.04,\ a+b+c=1.$$

A piezoelectric buzzer of the present invention is formed by using a piezoelectric ceramic, characterized in that the piezoelectric ceramic is formed using the piezoelectric ceramic composition mentioned above.

A piezoelectric actuator of the present invention is formed by using a piezoelectric ceramic, characterized in that the piezoelectric ceramic is formed by using the piezoelectric ceramic composition mentioned above.

With the piezoelectric ceramic composition prepared according to the present invention, since a part of the Pb atoms of the PZT has been displaced by La, and since Ti and Zr site (B site) have been partially displaced by Sb, it is possible to obtain a piezoelectric ceramic having high piezoelectric characteristics such as piezoelectric d constant and electromechanical coupling coefficient.

Further, with the piezoelectric ceramic composition prepared according to the present invention, since the B site is partially displaced by Cr, it is possible to practically maintain the piezoelectric characteristics of the piezoelectric ceramic, to reduce its electrical resistivity and to increase its heat resistance.

Moreover, with the piezoelectric ceramic composition prepared according to the present invention, since Cr is partially displaced by Sn, it is possible to inhibit possible deterioration of its piezoelectric characteristics which is otherwise caused due to the presence of Cr, while at the same time allowing the piezoelectric ceramic to maintain a good heat resistance. The reason for this fact may be explained as follows. Since the Sn will be dissolved into composition particles more readily than Cr, the process for Sb to be dissolved will be promoted. Since the precipitating amount of Sb onto the particle interfaces is reduced, it is possible to inhibit the formation of a different phase compound consisting of Pb and Sb, thereby improving the piezoelectric characteristics of the piezoelectric ceramic.

The above main object and other objects of the present invention, as well as the features and advantages of the invention, will become more readily understandable through a detailed description of preferred embodiments of the present invention.

DESCRIPTION OF THE PREFERRED EMBODIMENTS

EXAMPLE

Figure 1:
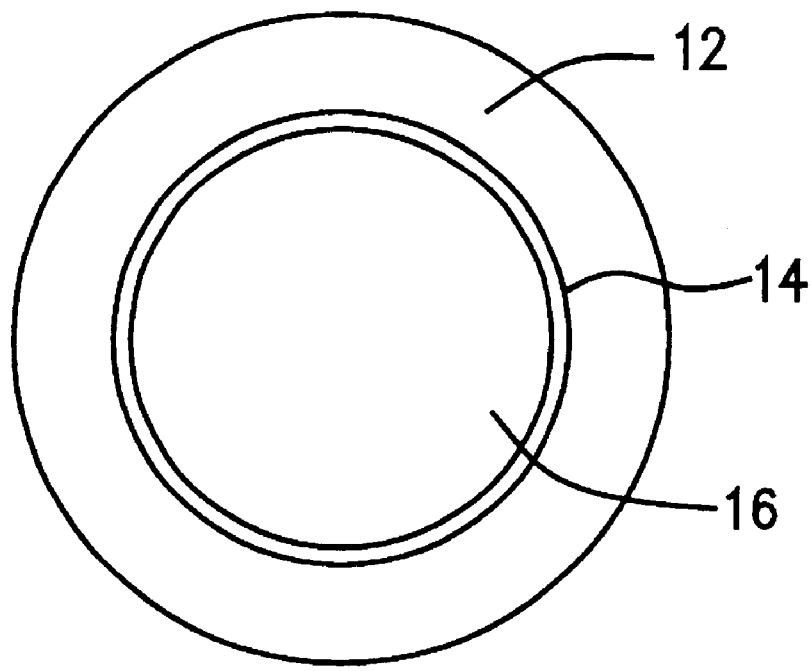
FIG. 1 is a plain view schematically indicating one example of a piezoelectric buzzer in which the present invention has been applied.

Raw material powders were prepared which include PbO, $La_2O_3$, $TiO_2$, $ZrO_2$, $Cr_2O_3$, $SnO_2$ and $Sb_2O_3$. Then, a powder mixture having a composition shown in Table 1 was prepared by weighing and obtaining an amount of each of the above powders. Afterwards, water was added in the powder mixture and a wet type mixing treatment was conducted for 16 hours with the use of a ball mill.

TABLE 1

| Sample No. | La | A | x | y | b | c |
|---|---|---|---|---|---|---|
| *1 | 0.0 | 0.99 | 0.47 | 0.30 | 0.020 | 0.030 |
| 2 | 0.2 | 0.99 | 0.47 | 0.30 | 0.020 | 0.030 |
| 3 | 1.0 | 0.99 | 0.47 | 0.30 | 0.020 | 0.030 |
| 4 | 2.0 | 0.99 | 0.47 | 0.30 | 0.020 | 0.030 |
| *5 | 3.0 | 0.99 | 0.47 | 0.30 | 0.020 | 0.030 |
| *6 | 1.0 | 0.93 | 0.47 | 0.30 | 0.020 | 0.030 |
| 7 | 1.0 | 0.94 | 0.47 | 0.30 | 0.020 | 0.030 |
| 8 | 1.0 | 0.96 | 0.47 | 0.30 | 0.020 | 0.030 |
| 9 | 1.0 | 1.00 | 0.47 | 0.30 | 0.020 | 0.030 |
| 10 | 1.0 | 1.02 | 0.47 | 0.30 | 0.020 | 0.030 |
| *11 | 1.0 | 1.03 | 0.47 | 0.30 | 0.020 | 0.030 |
| *12 | 1.0 | 0.99 | 0.44 | 0.30 | 0.020 | 0.030 |
| 13 | 1.0 | 0.99 | 0.46 | 0.30 | 0.020 | 0.030 |
| 14 | 1.0 | 0.99 | 0.51 | 0.30 | 0.020 | 0.030 |
| *15 | 1.0 | 0.99 | 0.53 | 0.30 | 0.020 | 0.030 |
| *16 | 1.0 | 0.99 | 0.47 | 0.00 | 0.020 | 0.030 |
| 17 | 1.0 | 0.99 | 0.47 | 0.01 | 0.020 | 0.030 |
| 18 | 1.0 | 0.99 | 0.47 | 0.50 | 0.020 | 0.030 |
| *19 | 1.0 | 0.99 | 0.47 | 1.00 | 0.020 | 0.030 |
| *20 | 1.0 | 0.99 | 0.47 | 0.30 | 0.000 | 0.030 |
| 21 | 1.0 | 0.99 | 0.47 | 0.30 | 0.010 | 0.030 |
| 22 | 1.0 | 0.99 | 0.47 | 0.30 | 0.030 | 0.030 |
| *23 | 1.0 | 0.99 | 0.47 | 0.30 | 0.040 | 0.030 |
| *24 | 1.0 | 0.99 | 0.47 | 0.30 | 0.020 | 0.000 |
| 25 | 1.0 | 0.99 | 0.47 | 0.30 | 0.020 | 0.010 |
| 26 | 1.0 | 0.99 | 0.47 | 0.30 | 0.020 | 0.040 |
| *27 | 1.0 | 0.99 | 0.47 | 0.30 | 0.020 | 0.050 |

The mixture obtained in the above process was dried and then calcined at a temperature of about 800 to 950° C., thereby obtaining a calcined powder. Subsequently, an organic binder was added to the powder which was in turn subjected to a pressing treatment so as to be formed into a predetermined shape, followed by firing at a temperature of about 1050 to 1200° C., thereby obtaining a desired ceramic. After that, the obtained ceramic was polished so as to be formed into a thin element having a thickness of 0.6 mm. Then, an electrode was formed on to each of the two main surfaces of the thin ceramic element, which thin ceramic element was in turn dipped in an electrically insulating oil in order to receive a polarization treatment under an electric field of 2 to 3 kV/mm. The ceramic obtained in the above process was then cut so as to be formed into smaller size piezoelectric elements each having a size of 3 mm×13 mm×0.6 mm.

The piezoelectric elements obtained in the above process were measured for their relative dielectric constants ($\epsilon_{33}^T/\epsilon_0$), piezoelectric properties ($k_{31}$, $|d_{31}|$), electrical resistivities ($\rho$) and Curie temperatures (Tc). Subsequently, the piezoelectric elements were heated and then measured for heat resistance. In detail, the heated elements were placed under a temperature of 240° C. for 3 minutes, and were measured for their piezoelectric properties ($k_{31}$, $|d_{31}|$) after having been held at room temperature for 24 hours. The measurement results are shown in Table 2. In Table 1 and Table 2, each sample number having a mark * is used to represent an example not falling within the scope of the present invention.

TABLE 2

| Sample No. | Measured Before Heating (to 240° C. for 3 minutes) | | | | | Measured After Heating | |
|---|---|---|---|---|---|---|---|
| | $\epsilon_{33}^T/\epsilon_0$ | $k_{31}$ (%) | $|d_{31}|$ (pC/N) | $\rho$ (× 10$^{10}$ Ω·m) | Tc (° C.) | $k_{31}$ (%) | $|d_{31}|$ (pC/N) |
| *1 | 1805 | 38.8 | 182 | 0.182 | 315 | 36.9 | 181 |
| 2 | 1873 | 40.1 | 202 | 0.201 | 310 | 39.8 | 200 |
| 3 | 1923 | 41.2 | 207 | 0.324 | 290 | 37.8 | 216 |
| 4 | 2048 | 41.3 | 216 | 0.773 | 265 | 37.0 | 209 |
| *5 | 2265 | 41.0 | 222 | 1.131 | 245 | 24.1 | 130 |
| *6 | Bad Sinterability | | | | | | |
| 7 | 1957 | 40.2 | 202 | 0.295 | 290 | 36.9 | 203 |
| 8 | 1945 | 40.6 | 206 | 0.301 | 290 | 37.2 | 206 |
| 9 | 1903 | 41.4 | 207 | 0.326 | 290 | 37.9 | 216 |
| 10 | 1881 | 41.6 | 207 | 0.341 | 290 | 37.7 | 209 |
| *11 | Bad Sinterability | | | | | | |
| *12 | 1692 | 39.8 | 184 | 0.198 | 285 | 39.0 | 186 |
| 13 | 1811 | 41.1 | 201 | 0.268 | 285 | 40.0 | 204 |
| 14 | 2188 | 39.7 | 212 | 0.481 | 295 | 36.4 | 200 |
| *15 | 1867 | 37.3 | 193 | 0.512 | 295 | 34.5 | 179 |
| *16 | 1820 | 39.0 | 190 | 0.285 | 290 | 36.5 | 195 |
| 17 | 1882 | 39.4 | 202 | 0.296 | 290 | 37.0 | 201 |
| 18 | 1978 | 41.0 | 216 | 0.711 | 290 | 36.4 | 206 |
| *19 | 2052 | 41.1 | 220 | 1.881 | 290 | 33.8 | 185 |
| *20 | 2120 | 41.8 | 226 | 2.443 | 305 | 30.7 | 168 |
| 21 | 1951 | 41.0 | 208 | 0.872 | 300 | 37.0 | 203 |
| 22 | 1903 | 40.8 | 201 | 0.202 | 295 | 37.8 | 202 |
| *23 | 1722 | 38.8 | 179 | 0.051 | 285 | 38.0 | 182 |
| *24 | 1349 | 30.9 | 147 | 0.088 | 315 | 30.1 | 138 |
| 25 | 1848 | 40.2 | 200 | 0.158 | 300 | 38.8 | 203 |
| 26 | 1985 | 41.3 | 211 | 0.701 | 280 | 36.9 | 207 |
| *27 | 2116 | 42.0 | 224 | 1.282 | 265 | 33.7 | 190 |

As shown in Table 1 and Table 2, the piezoelectric elements having the compositions falling within the scope of the present invention have a piezoelectric $d_{31}$ constant which is at least 200 pC/N. Further, after the piezoelectric elements were placed under a temperature of 240° C. for 3 minutes, their piezoelectric $d_{31}$ constants after being held at the room temperature for 24 hours were at least 200 pC/N.

On the other hand, if Pb content A is out of a range of the $0.94 \leq A \leq 1.02$ in the composition formula of the piezoelectric ceramic composition of the present invention, as in the cases of sample numbers 6 and 11, the piezoelectric ceramic will have a bad sinterability, hence making such a Pb content not preferable.

Further, a mole ratio of La (for displacing Pb) to Pb being less than about 0.2 mol % as in the case of sample number 1, or a mole ratio of Ti/Zr being out of the range of $0.46 \leq x \leq 0.51$ as in the cases of sample numbers 12 and 15, or a Sb content c being less than 0.01 as in the case of sample number 24, or a total content b of Sn and Cr being larger than 0.3 as in the case of sample number 23, or Cr not being displaced by Sn as in the case of sample number 16, are all found to have only a low piezoelectric $d_{31}$ constant which less than 200 pC/N, and hence not preferable.

Moreover, a mole ratio of La (for displacing Pb) to Pb being larger than about 2 mol % as in the case of sample number 5, is not preferable since the Curie temperature is 250° C. or lower and its heat resistance is low.

Further, an amount of Sn for displacing Cr being larger than 0.5 as in the case of sample number 19, a total amount of Cr and Sn being less than 0.01 as in the case of sample number 20, a Sb content being larger than 0.04 as in the case of sample number 27, are all found to have an increased insulating resistivity which is $1 \times 10^{10}$ Ω·m or higher. As a result, they have a bad heat resistance and thus not preferable.

According to the present embodiment, the piezoelectric ceramics in the scope of the present invention have a piezoelectric constant $d_{31}$ which is as large as $|d_3| \geq 200$ pC/N even if they have been placed under a temperature of 240° C. for 3 minutes and then under room temperature for 24 hours. The piezoelectric ceramic consisting of the piezoelectric ceramic composition of the present invention, when compared with a conventional piezoelectric ceramic, exhibits a higher piezoelectric characteristics ($k_{31}$, $|d_{31}|$) and a higher heat resistance.

Figure 2:
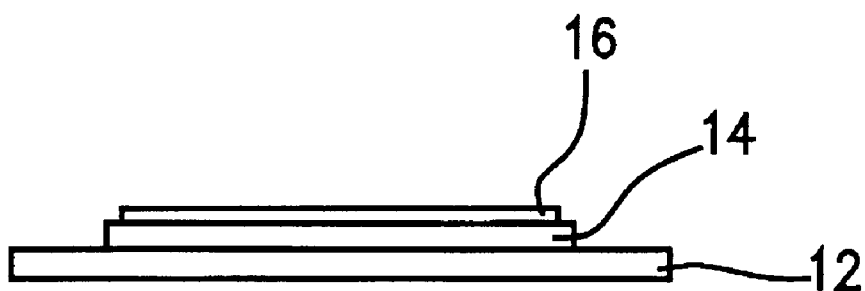
FIG. 2 is a front view schematically indicating the piezoelectric buzzer shown in FIG. 1.
Figure 3:
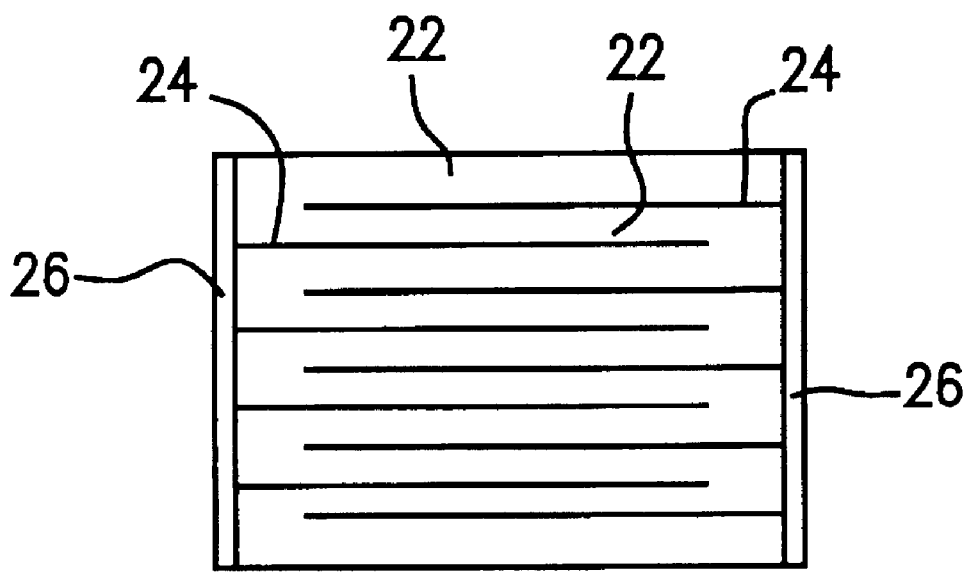
FIG. 3 is a side view schematically indicating one example of a piezoelectric actuator in which the present invention has been applied.

The piezoelectric ceramic composition of the present invention, for example, may be used to form a piezoelectric ceramic 14 of a piezoelectric buzzer 10 shown in FIG. 1 and FIG. 2, also may be used to form piezoelectric ceramics 22 of a piezoelectric actuator 20 shown in FIG. 3.

FIG. 1 is a plain view schematically indicating one example of a piezoelectric buzzer in which the present invention has been applied. FIG. 2 is a front view schematically indicating the piezoelectric buzzer shown in FIG. 1. As shown in FIG. 1 and FIG. 2, the piezoelectric buzzer 10 has for example a circular metal plate 12. Formed on the center of the circular metal plate 12 is, for example, a circular piezoelectric ceramic 14. The piezoelectric ceramic 14 is polarized in its thickness direction. Further, formed on the piezoelectric ceramic 14 is an electrode 16. In use of the piezoelectric buzzer 10, once an AC signal is input between the metal plate 12 and the electrode 16, the piezoelectric ceramic 14 and the metal plate 12 will vibrate, thereby producing a sound.

FIG. 3 is a side view schematically indicating one example of a piezoelectric actuator in which the present invention has been applied. As shown in FIG. 3, the piezoelectric actuator 20 has a plurality of short piece piezoelectric ceramics 22 which are laminated one upon another in a manner as shown in the drawing. These piezoelectric ceramics 22 are arranged in a manner such that every two mutually adjacent elements are polarized in opposite thickness directions. Further, between these piezoelectric ceramics 22 there are formed a plurality of internal electrodes 24. At this time, every other internal electrode 24 is caused to extend in the longitudinal direction of the piezoelectric ceramics 22 toward one side of the actuator 20, while every other internal electrode 24 of the remaining ones is caused to extend in the longitudinal direction of the piezoelectric ceramics 22 toward the other side of the actuator 20. In addition, on opposite side surfaces of the piezoelectric ceramics 22 there are formed external electrodes 26, 26. At this moment, one external electrode 26 is connected with every other internal electrode 24, while the other external electrode 26 is connected with every internal electrode 24 of the remaining ones. In use of the piezoelectric actuator 20, once a DC signal is applied in a predetermined direction to a position between the two external electrodes 26, 26, the actuator as a whole will expand in the thickness direction of the piezoelectric ceramics 22, thereby producing an action on another element such as a switch.

The piezoelectric ceramic of the present invention may also be used in other piezoelectric devices. In this way, it is possible for a piezoelectric ceramic to obtain a higher piezoelectric characteristics and a higher heat resistance than a conventional one.

With the use of the present invention, it has become possible to obtain a piezoelectric ceramic composition which can enable a piezoelectric ceramic to obtain a higher piezoelectric characteristics and a higher heat resistance than the conventional one.

By using the piezoelectric ceramic composition of the present invention to produce piezoelectric buzzer or piezoelectric actuator, it is possible to obtain a piezoelectric device which exhibits a high stability in a reflow furnace or when driven at a high temperature, and can offer a large electric field induced displacement.

Various changes and modifications can be made without departing from the spirit and scope of the invention. The embodiments described above were intended to illustration the invention without limiting it.

What is claimed is:

1. A piezoelectric ceramic composition comprising a lead zirconate titanate (PZT) represented by the composition formula

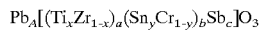

in which $0.94 \leq A \leq 1.02$, $0.46 \leq x \leq 0.51$, $0.01 \leq y \leq 0.5$, $0.01 \leq b \leq 0.03$, $0.01 \leq c \leq 0.04$, a+b+c=1, wherein about 0.2 to 2 mol % of the Pb atoms have been displaced by La.

2. The piezoelectric ceramic composition of claim 1, wherein 1 to 2 mol % of the Pb atoms have been displaced by La.

3. The piezoelectric ceramic composition of claim 2, wherein $0.96 \leq A \leq 1.00$, $0.47 \leq x \leq 0.51$, $0.01 \leq y \leq 0.3$, $0.01 \leq b \leq 0.02$ and $0.01 \leq c \leq 0.03$.

4. The piezoelectric ceramic composition of claim 1, wherein $0.96 \leq A \leq 1.00$, $0.47 \leq x \leq 0.51$, $0.01 \leq y \leq 0.3$, $0.01 \leq b \leq 0.02$ and $0.01 \leq c \leq 0.03$.

5. A piezoelectric buzzer comprising a piezoelectric ceramic, characterized in that said piezoelectric ceramic is the piezoelectric ceramic composition of claim 4.

6. A piezoelectric buzzer comprising a piezoelectric ceramic, characterized in that said piezoelectric ceramic is the piezoelectric ceramic composition of claim 3.

7. A piezoelectric buzzer comprising a piezoelectric ceramic, characterized in that said piezoelectric ceramic is the piezoelectric ceramic composition of claim 2.

8. A piezoelectric buzzer comprising a piezoelectric ceramic, characterized in that said piezoelectric ceramic is the piezoelectric ceramic composition of claim 1.

9. A piezoelectric actuator comprising a piezoelectric ceramic, characterized in that said piezoelectric ceramic is the piezoelectric ceramic composition of claim 1.

10. A piezoelectric actuator comprising a piezoelectric ceramic, characterized in that said piezoelectric ceramic is the piezoelectric ceramic composition of claim 2.

11. A piezoelectric actuator comprising a piezoelectric ceramic, characterized in that said piezoelectric ceramic is the piezoelectric ceramic composition of claim 3.

12. A piezoelectric actuator comprising a piezoelectric ceramic, characterized in that said piezoelectric ceramic is the piezoelectric ceramic composition of claim 4.

* * * * *